(12) United States Patent  
Meloni

(10) Patent No.: US 8,366,874 B2  
(45) Date of Patent: Feb. 5, 2013

(54) REMOVING AND SEGREGATING COMPONENTS FROM PRINTED CIRCUIT BOARDS

(75) Inventor: Mark Meloni, Longmont, CO (US)

(73) Assignee: Empire Technology Development LLC, Wilmington, DE (US)

(*) Notice: Subject to any disclaimer, the term of this patent is extended or adjusted under 35 U.S.C. 154(b) by 0 days.

(21) Appl. No.: 13/131,111

(22) PCT Filed: Aug. 9, 2010

(86) PCT No.: PCT/US2010/044860  
§ 371 (c)(1),  
(2), (4) Date: May 25, 2011

(87) PCT Pub. No.: WO2012/021120  
PCT Pub. Date: Feb. 16, 2012

(65) Prior Publication Data  
US 2012/0031566 A1    Feb. 9, 2012

(51) Int. Cl.  
*B32B 38/10* (2006.01)

(52) U.S. Cl. ........ 156/708; 156/711; 156/752; 156/757; 156/930; 156/941; 29/426.3; 29/426.4; 29/564.1; 29/762

(58) Field of Classification Search .......... 156/706, 156/708, 711, 752, 757, 930, 941; 29/426.3, 29/426.4, 426.5, 564.1, 762, 403.3  
See application file for complete search history.

(56) References Cited

U.S. PATENT DOCUMENTS

| 4,813,589 A | 3/1989 | Palmer et al. |
| 5,560,100 A | 10/1996 | Englert |
| 2001/0030220 A1* | 10/2001 | Willis et al. .............. 228/37 |
| 2006/0124241 A1* | 6/2006 | Doi et al. ................ 156/344 |

FOREIGN PATENT DOCUMENTS

| JP | 06-151032 A | * | 5/1994 |
| JP | 2007035774 A | * | 2/2007 |

OTHER PUBLICATIONS

Machine translation of Japanese Patent Publication 2007-35774. 2007.*  
Yang, J. et al., Removal force models for component disassembly from waste printed circuit board, Resources, Conservation and Recycling, 2009, pp. 448-454, vol. 53.  
Chien, Y. et al., Liquefaction of printed circuit board wastes with product oil recycling, Journal of Environmental Science and Health, Part A, 2000, pp. 635-644, 35 (4), Taylor & Francis, London, UK.  
Li, J. et al., Recycle Technology for Recovering Resources and Products from Waste Printed Circuit Boards, Environmental Science & Technology, 2007, pp. 1995-2000, 41 (6), American Chemical Society, published on the internet on Feb. 7, 2007.  
Australia Search Authority, International Search Report and Written Opinion, Dec. 16, 2010, pp. 1-12, Australian Patent Office.

* cited by examiner

*Primary Examiner* — Mark A Osele

(57) ABSTRACT

Implementations and techniques for removing and segregating components from printed circuit boards are generally disclosed.

12 Claims, 9 Drawing Sheets

800 A computer program product

802 A signal bearing medium

804 at least one of one or more instructions for formatting data to instruct a process unit to secure a printed circuit board;

one or more instructions for formatting data to instruct the process unit to direct air onto a surface of the printed circuit board with a directed air source to remove a first component from the printed circuit board;

one or more instructions for formatting data to instruct the process unit to collect the first component from the printed circuit board;

one or more instructions for selecting a parameter for directing the air, wherein the parameter includes at least one of an air velocity, an air temperature, a directed air source scan duration or a directed air source scan path;

one or more instructions for selecting a second parameter for directing a second air;

one or more instructions for formatting data to instruct the process unit to direct the second air onto the surface of the printed circuit board with the directed air source to remove a second component;

one or more instructions for formatting data to instruct the process unit to collect the second component, wherein the first component is collected in a first collector and the second component is collected in a second collector; or one or more instructions for formatting data to instruct the process unit to direct a second air onto a second surface of the printed circuit board with a second directed air source to remove a second component.

| 806 a computer-readable medium | 808 a recordable medium | 810 a communications medium |

Fig. 8

REMOVING AND SEGREGATING COMPONENTS FROM PRINTED CIRCUIT BOARDS

CROSS-REFERENCE TO RELATED APPLICATIONS

The present application is a U.S. national stage application claiming the benefit of International Application No. PCT/US2010/044860, filed on Aug. 9, 2010, the entire contents of which are incorporated herein by reference.

BACKGROUND

Unless otherwise indicated herein, the approaches described in this section are not prior art to the claims in this application and are not admitted to be prior art by inclusion in this section.

Waste from electronics may include a mix of materials, such as plastics, metals, ceramics, fiberglass, precious metals, toxic materials and others. Removing and segregating materials from the electronics waste may be time consuming and difficult.

SUMMARY

In accordance with some implementations, methods for removing components from a printed circuit board may include securing the printed circuit board, directing air onto a surface of the printed circuit board with a directed air source to remove a component from the printed circuit board and collecting the component.

In accordance with some implementations, systems arranged to remove components from a printed circuit board may include an assembly configured to secure the printed circuit board, a directed air source configured to direct air onto a surface of the printed circuit board and a collector configured to collect a component removed from the printed circuit board.

In accordance with some implementations, an article may include a computer program product having stored therein instructions that, if executed by a processing unit, configure the processing unit to secure a printed circuit board, direct air onto a surface of the printed circuit board with a directed air source to remove a component from the printed circuit board and collect the component from the printed circuit board.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings:

FIG. 8 is an illustration of an example computer program product; and

DETAILED DESCRIPTION

Figure 1:
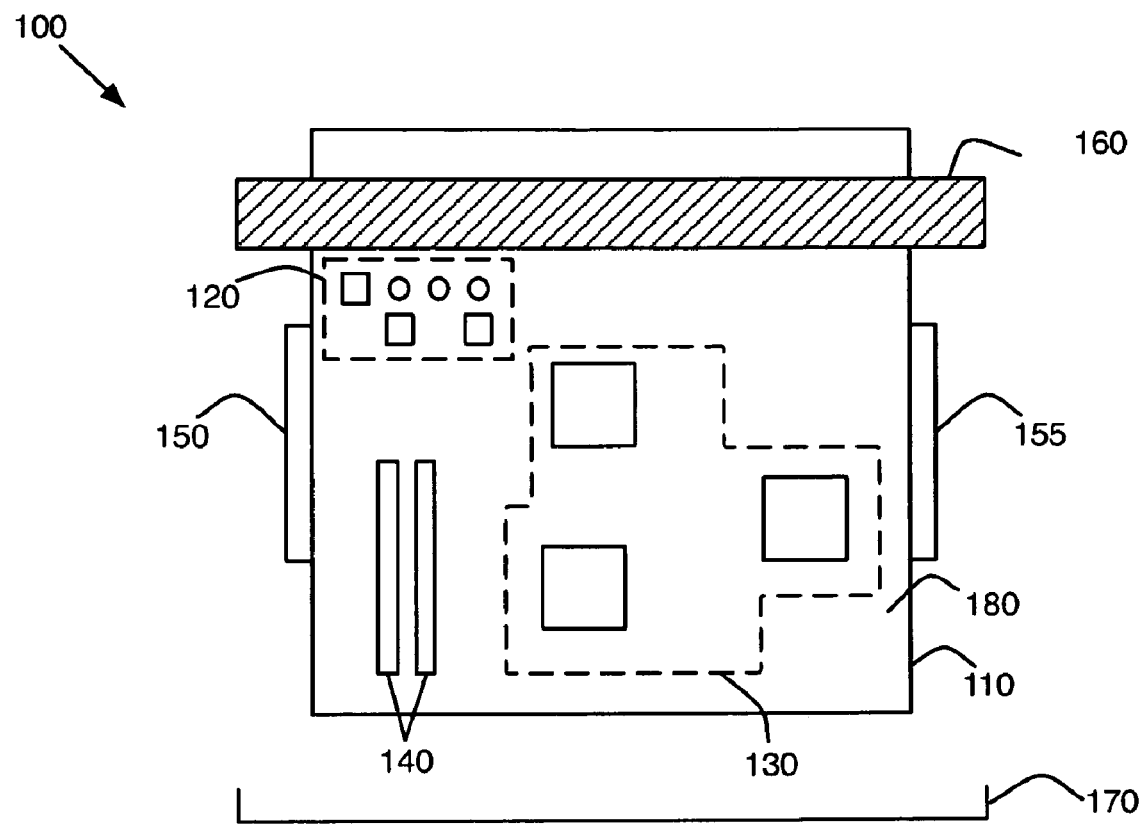
FIG. 1 is an illustration of an example apparatus for removing and segregating components from a printed circuit board.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatuses, systems and computer readable media related to removing and segregating components from printed circuit boards.

It may be desirable to segregate electronics waste such that the segregated materials may be more efficiently disposed of, recycled or reused. In some examples, electronics waste may include printed circuit boards having components attached to one or both sides of the printed circuit board. The printed circuit board and attached components may include, for example, polymers, other non-metallic materials, Copper, solder material, Iron and ferrite, Nickel, Silver, Gold, Palladium, Bismuth, Antimony or Tantalum, or the like. It may be desirable to automatically segregate Copper and fiberglass printed circuit boards from different types of attached components. In various embodiments described herein, waste materials may be segregated for improved disposal.

In an embodiment, a printed circuit board having a variety of components attached thereto may be provided or received, and the printed circuit board may be secured for processing. A directed air source or multiple directed air sources may be configured to direct air onto a surface or surfaces of the printed circuit board to assist in dislodging some or all of the components. The dislodged or removed components may be collected for further processing.

In some examples, the components may be collected into a single collector and, if desired, they may subsequently be segregated. In other examples, components may be segregated into separate collectors as they are removed. In general, different components may require different amounts of energy (kinetic and thermal) or different forces to be removed from the printed circuit board. In some examples, heated air may be used to remove components. In other examples, cooled air may be used. More easily removed components may be removed at less extreme temperatures or a lower velocity of air over a relatively shorter processing duration while components that may be more difficult to remove may require relatively more extreme temperatures or relatively higher velocities over a relatively longer processing duration. By first providing air at a relatively low predetermined velocity or less extreme temperature or a shorter processing duration, some of the components may be removed and collected while other components may remain on the printed circuit board. Subsequently, another temperature or velocity or processing duration of air may remove some of the remaining components into a separate collector. Similar processing may be repeated such that components may be segregated into separate collectors as they are removed from the printed circuit board. Such segregation may offer faster, more efficient and more highly automated processing. After removal and segregation of the components, they may be further segregated for disposal, recycle or reuse.

FIG. 1 is an illustration of an example apparatus 100 that may be configured to remove and/or segregate components from a printed circuit board 110 in accordance with at least some embodiments described herein. Apparatus 100 may include grippers 150, 155 configured to secure printed circuit board 110 and a directed air source 160 configured to remove components from printed circuit board 110. Apparatus 110 may also include a collector 170 configured to collect removed components. Printed circuit board 110 may be provided with, for example, various components 120, 130, 140 on a surface 180 of printed circuit board 110.

Figure 2:
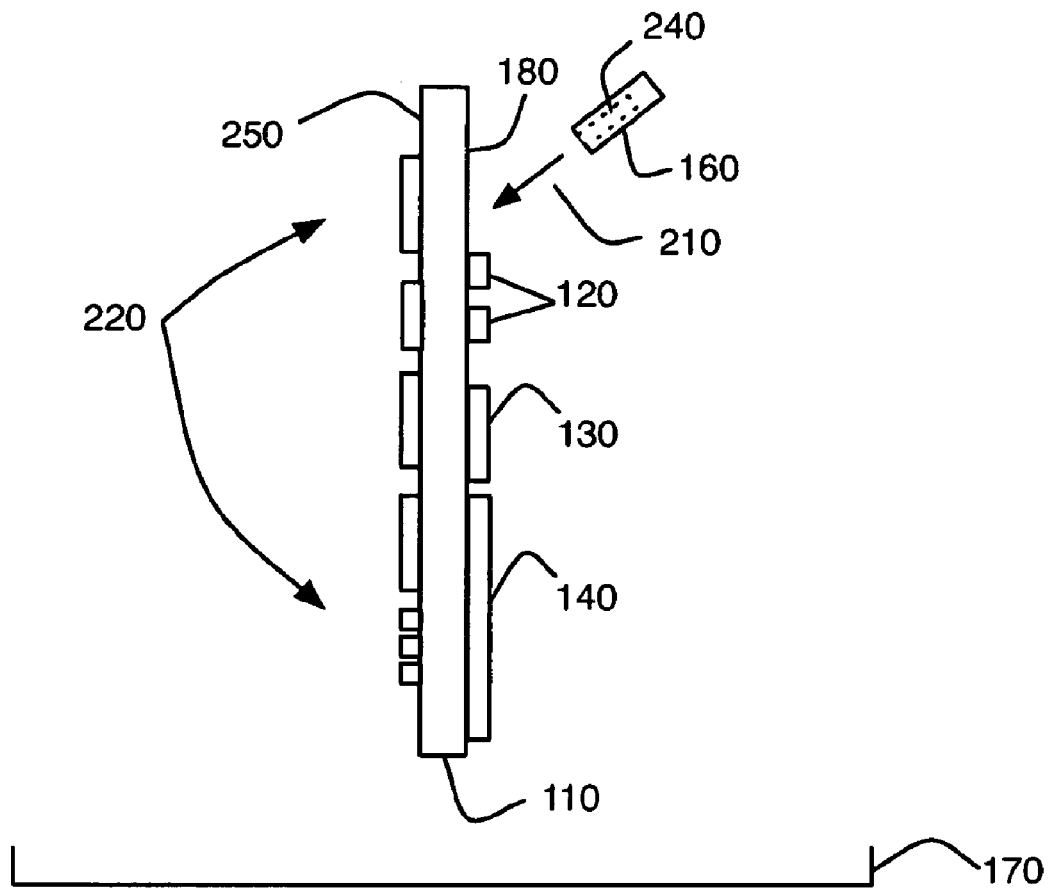
FIG. 2 is an illustration of an example apparatus for removing and segregating components from a printed circuit board.

FIG. 2 is an illustration of a side view of apparatus 100 and printed circuit board 110 arranged in accordance with at least some examples described herein. As shown, printed circuit board 110 may include components 220 on a surface 250 of printed circuit board 110. In FIG. 2, grippers 150, 155 are not shown for the sake of clarity of presentation. Directed air source 160 may be configured to direct air 210 onto surface 180 of printed circuit board 210 via a port 240. Air 210 may generally be provided with sufficient energy to remove some or all of components 120, 130, 140, 220 so they may be collected in collector 170. Directed air source 160 may be configured to scan in any direction across surface 180 to facilitate removal of components 120, 130, 140 and/or 220.

Figure 3:
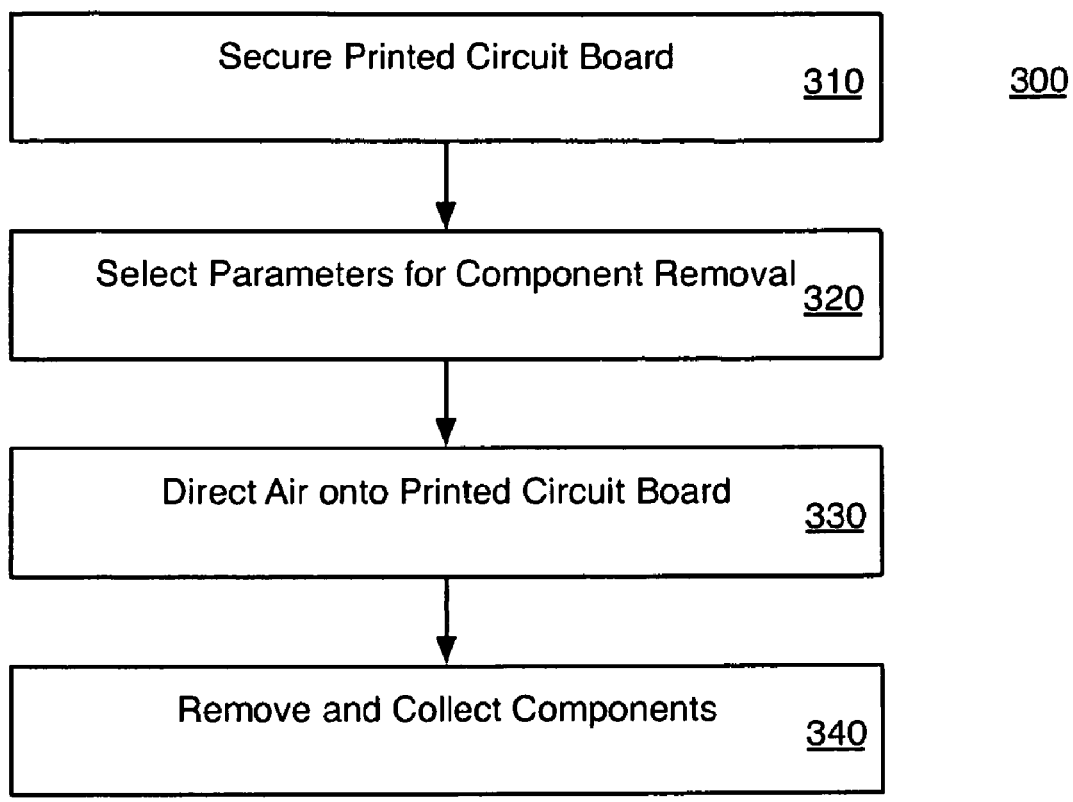
FIG. 3 is an illustration of a flow chart of an example method for removing components from a printed circuit board.

FIG. 3 is an illustration of a flow chart of an example method 300 for removing components from a printed circuit board in accordance with at least some examples described herein. Method 300 may include one or more functions, operations or actions as illustrated by one or more of blocks 310, 320, 330 and/or 340. In some examples, method 300 may be implemented under the control of a computer system, as is discussed further herein. Processing for method 300 may begin at block 310.

At block 310, a printed circuit board having components attached thereto may be provided or attained, and secured. In an example, printed circuit board 110 may be secured using grippers 150, 155 (please refer to FIG. 1). Processing may continue at block 320.

At block 320, a parameter or parameters may be selected for the removal of components from the printed circuit board. As discussed herein, a variety of parameters may be chosen, such as, but not limited to, the velocity of air provided, the temperature of air provided, a scan duration, a scan direction or the like. In addition to or in place of continuous flow of heated air, pulsed flows may be used. In general, the parameters may be selected to provide sufficient energy or force to remove some or all of the components from the secured printed circuit board and they may be selected using any of the techniques discussed herein. In various examples, the parameters may be selected by a user or by a process unit as described with respect to FIG. 7. Processing may continue at block 330.

At block 330, air may be directed onto the printed circuit board. In an example, directed air source 160 may be configured to direct air 210 onto surface 180 of printed circuit board 110 using the chosen parameter or parameters. Processing may continue at block 340.

At block 340, the components may be removed and collected. In an example, some or all of components 120, 130, 140 may be removed from printed circuit board 110 and collected in collector 170. The collected components may be disposed of recycled, or reused separately from the printed circuit board. In some examples, the components may be further segregated for disposal.

Figure 4:
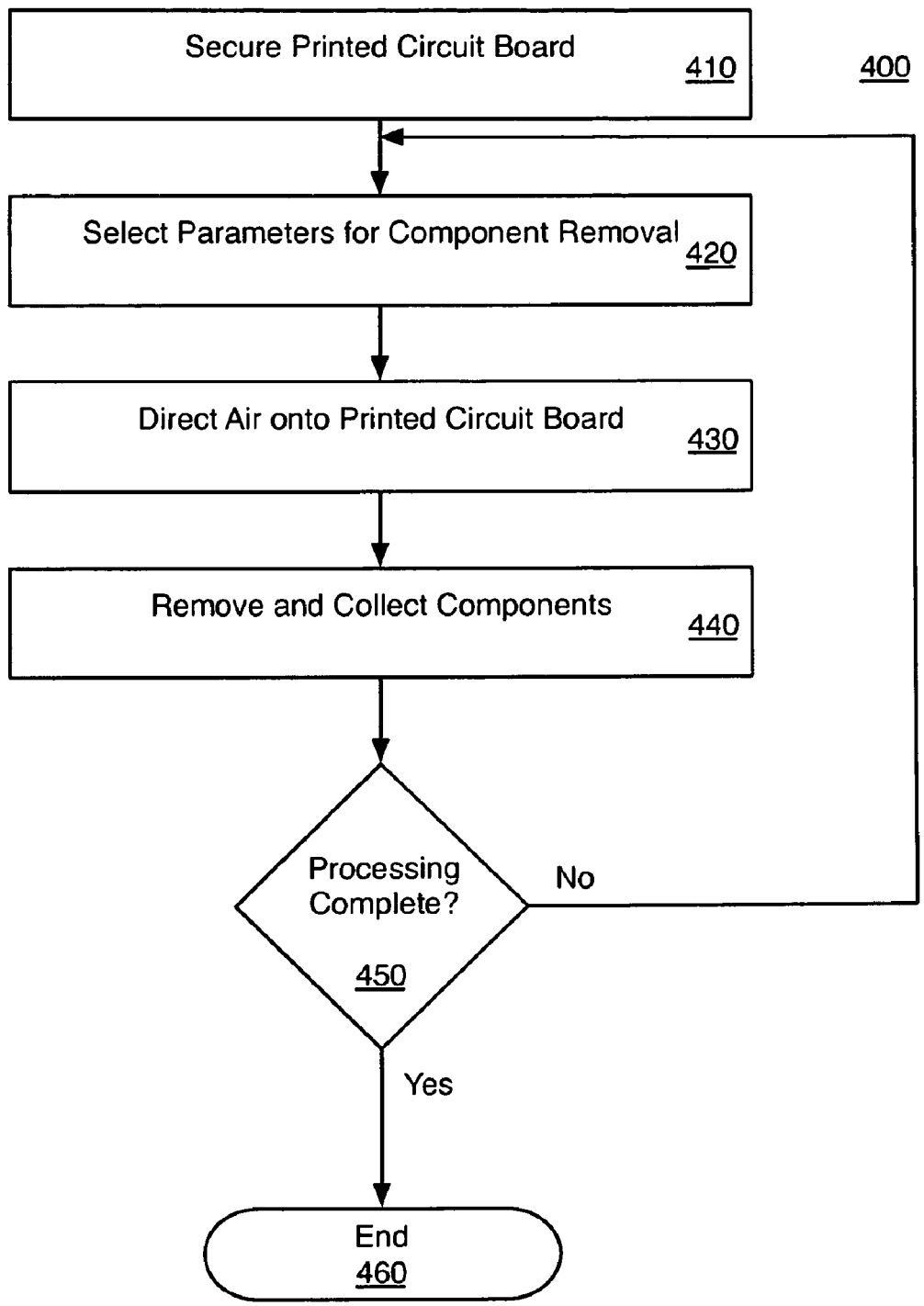
FIG. 4 is an illustration of a flow chart of an example method for removing and segregating components from a printed circuit board.

FIG. 4 is an illustration of a flow chart for removing and segregating components from a printed circuit board in accordance with at least some embodiments of the present disclosure. A method 400 may be configured for removal and automatic segregation of components from a printed circuit board. Method 400 may include one or more functions, operations or actions as illustrated by one or more of blocks 410, 420, 430, 440, 450 and/or 460. In some examples, method 400 may be implemented under the control of a computer system, as is further described herein. Processing for method 400 may begin at block 410.

At block 410, a printed circuit board having a variety of components attached thereto may be provided or attained, and secured. In an example, printed circuit board 110 may be secured using grippers 150, 155. In some examples, the components to be removed may be categorized by how much energy may be required to remove them from the printed circuit board. For the sake of illustration of example and clarity of discussion, components 120, 130, 140 may be categorized by type based on ease of removal from printed circuit board 110 such that components 120 are relatively the easiest to remove, components 140 are relatively the most difficult to remove and components 130 are more easy to remove than components 140 but more difficult to remove than components 120. Processing may continue from block 410 to block 420.

At block 420, a removal parameter or parameters may be chosen. Any method or technique for selecting removal parameters and any of the removal parameters discussed herein may be used. In some examples, the removal technique or parameters may be based on a velocity or temperature of the air, a process duration or directed air source scan rate, a number of scan passes, or a scan path or configuration. The process parameters may be chosen to remove a first type or category of components from the printed circuit board while other types or categories may not be removed. In the illustrated example, the energy may be chosen such that components 120 may be removed from printed circuit board 110 while components 130, 140 may not be removed. In various examples, the parameters may be selected by a user or by a process unit as described with respect to FIG. 7. Processing may continue from block 420 to block 430.

At block 430, air may be directed onto a surface of the printed circuit board using the selected parameter or parameters. In an example, directed air source 160 may be configured to direct air 210 onto surface 180 of printed circuit board 110 at the selected parameters. In some examples, block 430 may be preceded by a preprocessing step or steps including, but not limited to, a cleaning step or a preheating step. Processing may continue from block 430 to block 440.

At block 440, components may be removed based on the application of the air onto the printed circuit board and collected. In an example, a first type or category of components may be removed and collected. In the illustrated example, components 120 may be removed and collected into collector 170 based on the application of air 210 at the chosen parameter or parameters. Processing may continue from block 440 to block 450.

At block 450, a decision may be made as to whether the processing is complete. The decision may be based, for example, on whether additional components may be removed from the printed circuit board. In an example, if a counter variable matches a predetermined number of processing cycles, processing may be complete. In other examples, the printed circuit board may be analyzed to determine, for example, if the desired components may have been removed such that processing may be complete. In an example, a collector may be weighed to determine if an expected mass of components were removed from the printed circuit board or video inspection may be made of printed circuit board 110 and it may be determined that processing may be complete. In various examples, the decision may be made by a user or by a process unit as described with respect to FIG. 7. If the processing is determined to be complete, the method may continue from block 450 to an end at block 460. If the processing is determined to be not complete, the processing may continue from block 450 to block 420. In some examples, additional component types or categories may be desired to be removed using different processing parameters and processing therefore may return to block 420. In the illustrated example, components 130, 140 may remain on printed circuit board 110 and processing may return to block 420 for some or all of their removal.

At block 420 parameters may again be selected for removing components from the printed circuit board. In an example, the parameters may generally be increased to a higher threshold, such as a higher or lower air temperature, such that more difficult to remove components may be removed from printed circuit board 110. Any of the methods or techniques discussed herein may be used to select removal parameters. In various examples, the parameters may be selected by a user or by a process unit as described with respect to FIG. 7. The method 400 may again continue from block 420 to blocks 430, 440 and 450 such that additional components may be removed and collected. In an example, a second type or category of components may be removed and collected into a different collector such that the components are automatically segregated as they may be removed from the printed circuit board. The second type or category may be more difficult to remove from the printed circuit board than, for example, the type or category of components previously removed. In the illustrated example, components 130 may be removed into a separate collector while components 140 may remain attached to printed circuit board 110.

The method may continue to block 450 such that it may be determined whether the processing may be complete. If processing is complete, the method may continue to an end at block 460. If processing is not complete, the method may continue by returning to block 420 and the processing may continue as described herein until all the desired types and categories of components may be removed and segregated from the printed circuit board. In the illustrated example, components 140 may be removed and segregated by further processing and, upon return to block 450, the process may end at block 460. Method 400 may thereby provide for the removal and automatic segregation into separate collectors of different types of components.

Although the illustrated example provided three categories or types of components, any number of categories may be used. In some examples, two categories may be used. In other examples, two, four or five categories may be used. A category or type of component may be defined with respect to the size (xx mm^2), type (surface mount, through board), pin/pad count (2 pad resistor, 100 pad BGA) or other parameters of the associated components.

As shown in FIG. 1, printed circuit board 110 may be secured using grippers 150, 155. In an example, the grippers may be a part of a robotic gripper assembly. In an example, grippers 150, 155 may be automated to secure printed circuit board 110. In other examples, printed circuit board 110 may be secured using a printed circuit board holder, a printed circuit board vice, a printed circuit board cradle, or the like. In an example, printed circuit board 110 may be secured using a printed circuit board handling system having an incorporated air knife. As shown, apparatus 100 may include collector 170. Collector 170 may be any device suitable for collecting components 120, 130, 140, 220 as they may be removed from printed circuit board 110. In various examples, collector 170 may be a bin, container, bucket, conveyor or the like.

As shown in FIG. 2, directed air source 160 may be configured to direct air 210 onto surface 180 of printed circuit board 110. In various examples, directed air source 160 may be configured to scan across printed circuit board 110. Air 210 may be provided with sufficient energy to remove some or all of components 120, 130, 140, 220. Various parameters may be controlled to vary the energy provided to remove components 120, 130, 140, 220. In some examples, the parameter may be the velocity of air 210 or an air velocity. In other examples, the parameter may be the temperature of air 210 or an air temperature. In other examples, the parameter may be a scan rate or scan velocity of directed air source 160 or an air knife scan rate. In other examples, the parameter may be a scan duration of directed air source 160, a component soak time, or an air knife scan duration. In general, a greater air velocity may provide more removal energy or force, a higher heated air temperature or a lower cooled air temperature may provide more removal energy or force, a slower air knife scan rate may provide more removal energy or force, and a longer air knife scan duration may provide more removal energy or force.

Directed air source 160 may be configured to scan in a variety of patterns or paths such that air 210 may contact components 120, 130, 140, 220 from a variety of directions and at a variety of angles. In an example, directed air source 160 may be configured to scan in a downward direction. In other examples, directed air source 160 may be configured to scan in an upward direction or in a horizontal direction. As is described herein, in other examples, directed air source 160 may be configured to scan using various other scan paths. In some examples, printed circuit board 110 may be secured and stationary while directed air source 160 moves. In other examples, directed air source 160 may be stationary while printed circuit board 110 moves. In other examples, both printed circuit board 110 and directed air source 160 may move. In some examples, components 120, 130, 140 may be removed from surface 180 and the orientation of printed circuit board 110 and directed air source 160 may be modified such that directed air source 160 may be situated to remove components 220.

In an example, directed air source 160 may be an air knife suitable for removing components from printed circuit board 110. Directed air source 160 may be provided in a variety of shapes and configurations. In an example, directed air source 160 may be longer or about the length of an edge of printed circuit board 110 such that it may span an entirety of printed circuit board 110 and the entire board may be contacted by air 210 during a single pass or scan. In other examples, directed air source 160 may be smaller than an edge of printed circuit board 110 such that directed air source 160 may span only a portion of printed circuit board 110 and, if desired, directed air source 160 may be moved about the area of printed circuit board 100 to contact it with air. In various examples, directed air source 160 may have a length ranging form about 0.125 inches to about 30 inches.

As shown, in some examples, one directed air source may be used. In other examples, and as discussed described herein, any number of directed air sources may be used. In some examples, two to six directed air sources may be used. In other examples, six to 20 directed air sources may be used.

Directed air source 160 may include a discharge slot or slots, a discharge hole or holes, or a discharge nozzle or nozzles. In some examples, directed air source 160 may have a discharge slot or slots that may have a length of about 0.001 inches to about 0.5 inches. In other examples, directed air source 160 may have a discharge slot or slots that may have a length of about 0.5 inches to about 12 inches. In other examples, directed air source 160 may have a discharge slot that may have a length of about 12 inches to about 30 inches. In some examples, a discharge slot may run along substantially an entire length of directed air source 160. In other examples, directed air source 160 may have a series of discharge slots running along the length of directed air source 160. In such examples, the slots may be the same length or they may be different lengths. The slot or slots may have any suitable width. In various examples, the slot or slots may have a width in the range of about 0.001 inches to about 1.5 inches.

In some examples, directed air source 160 may have discharge holes, ports or nozzle openings that may have a diameter of about 0.001 inches to about 0.5 inches. In other examples, directed air source 160 may have discharge holes, ports or nozzle openings that may have a diameter of about 0.5 inches to about 1.5 inches. In some examples, discharge holes, ports or nozzles may run across a length of directed air source 160 and the discharge holes or nozzles may be the same diameter or they may be different.

As discussed, in some examples, directed air source 160 may include several slots, holes, ports or nozzles. In such examples, the velocity and/or temperature of the air provided from each slot, hole, port or nozzle may be separately controlled. Directed air source 160 may be fed by tubing or piping that may be coupled to other processing equipment, such as, but not limited to, a compressor, a blower, an air generator, a heater, a cooler or the like. Any tubing, piping or additional processing equipment used to feed the illustrated directed air source is not shown for the sake of clarity of presentation. As is discussed herein with respect to FIG. 7, apparatus 100 may be coupled to a process control unit that may control the various components of the process unit or apparatus 100.

In various examples, directed air source 160 may be configured to provide air 210 onto surfaces 180, 250 of printed circuit board 110 at any velocity and temperature sufficient to remove some or all of components 120, 130, 140, 220. In some examples, the air velocity may be in the range of about 5,000 ft/min to about 20,000 ft/min. In other examples, the air velocity may be in the range of about 20,000 ft/min to about 50,000 ft/min. In other examples, the air velocity may be in the range of about 50,000 ft/min to about 65,000 ft/min. The velocity of air may be constant over printed circuit board 110 or it may be varied. In an example, the velocity of the air may be at a first setting over a first part of surface 180 and at a different setting at a second part of surface 180.

In some examples, heated air may be used. Air temperatures above ambient may provide softening or melting of solder and adhesives such that the components may be removed. For example, lead-tin and tin solders may melt at temperatures of approximately 150° C. to 300° C. and adhesives such as polyurethanes may breakdown at temperatures of about 250° C. and soften at lesser temperatures. In some examples, the heated air temperature may be in the range of about 150° C. to about 300° C. In other examples, the heated air temperature may be in the range of about 300° C. to about 400° C. In other examples, the heated air temperature may be in the range of about 400° C. to about 600° C.

In other examples, cooled air may be used. Air temperatures below ambient may be used to provide stresses between components and a printed circuit board due to CTE (coefficient of thermal expansion) mismatch and/or simultaneous embrittling of solder or adhesives due to low temperature. The combination of stress and embrittlement may lead to fracture and release of a mounted component. For example, PVC material may readily undergo brittle fracture at temperatures of about 0° C. In some examples, the cooled air temperature may be in the range of about −50° C. to about 0° C. In other examples, the cooled air temperature may be in the range of about −150° C. to about −50° C. Air 210 may provided onto surfaces 180, 250 at any suitable angle. In some examples, heated air 201 may be provided substantially parallel to the surface of printed circuit board 110. In other examples, the angle between the surface and the heated air may be in the range of about 0° to about 30°. In some examples, the angle may be in the range of about 30° to about 60°. In other examples, the angle may be in the range of about 60° to about 90°.

Directed air source 160 may be configured to scan over surface 180, 250 in any suitable direction and along any suitable pathway. In an example, the air knife may run from one edge of the board to another, the air knife may be rotated, and the air knife may be scanned to the first edge such that opposite sides of components 120, 130, 140, 220 may be contacted by air 210. Other examples of paths include, but are not limited to, circular patterns, zig-zag patterns, x-shaped patterns or crossing patterns. Directed air source 160 may be configured to scan at any suitable scanning speed. In some examples, directed air source 160 may be scanned at a rate of about 0.01 inches per second to about 1 inch per second. In other examples, directed air source 160 may be scanned at a rate of about 1 inch per second to about 5 inches per second. In other examples, directed air source 160 may be scanned at a rate of about 5 inches per second to about 40 inches per second. The scan rate may be constant or it may be varied over different portions of printed circuit board 110. In various examples, the scan rate may correspond to a process duration such that the process duration may be the length of the scan path divided by the scan rate. In an example, the scan may be paused at a component or components so that they may soaked for an extended duration or soak time.

Printed circuit board 110 may be any suitable printed circuit board. In some examples, printed circuit board 110 may be a computer motherboard. In other examples, printed circuit board 110 may be a circuit board from electronics devices including, but not limited to, cell phones, personal data assistants, personal media player devices, wireless web-watch devices, personal headset devices, application specific devices, or hybrid devices.

Components 120, 130, 140, 220 may include any suitable components or devices that may be incorporated into an electronics device by mounting onto a printed circuit board. In various examples, components 120, 130, 140, 220 may be devices including, but not limited to, resistors, capacitors, microprocessors, memory devices, or through-hole devices such as chip headers or expansion slots. In FIG. 1, the components may be grouped together on surface 180 of printed circuit board 110. However, such a grouping is for clarity of presentation. In general, the components may be located about surface 130 in any manner.

In some examples, components 120 may include small surface mount devices that may be removed from printed circuit board 110 with a relatively low amount of energy or force. Components 120 may include, for example, resistors or capacitors that may be attached to printed circuit board 110 with a relatively small amount of solder, may have a relatively low pin count, or may have a relatively low thermal mass. In some examples, components 130 may include larger surface mounted components. Components 130 may include, for example, microprocessors or memory devices. In some examples, components 140 may include through hole devices such as chip headers or expansion slots that may have pins penetrating through printed circuit board 110. The separation of components into the categories or types described may be just one example categorization. In other applications or examples, other categorizations may be made.

In some examples, as components may be removed from printed circuit board 110 using directed air source 160, they may be collected in collector 170. Collector 170 may include any apparatus suitable for catching or collecting the components. In some examples, the collected components may be further sorted at subsequent processing steps. The sorting may be manual or it may be automatic, using, for example, automated sorting equipment. In some examples, the components may be sorted based on their type. In other examples, the components may be sorted by the material or materials they contain.

As discussed, in some examples, components may be sequentially removed from printed circuit board 110 into separate collectors such that the components are presorted or segregated based on their removal, with components that may be more easily removed presorted or segregated from components that may be more difficult to remove.

Figure 5:
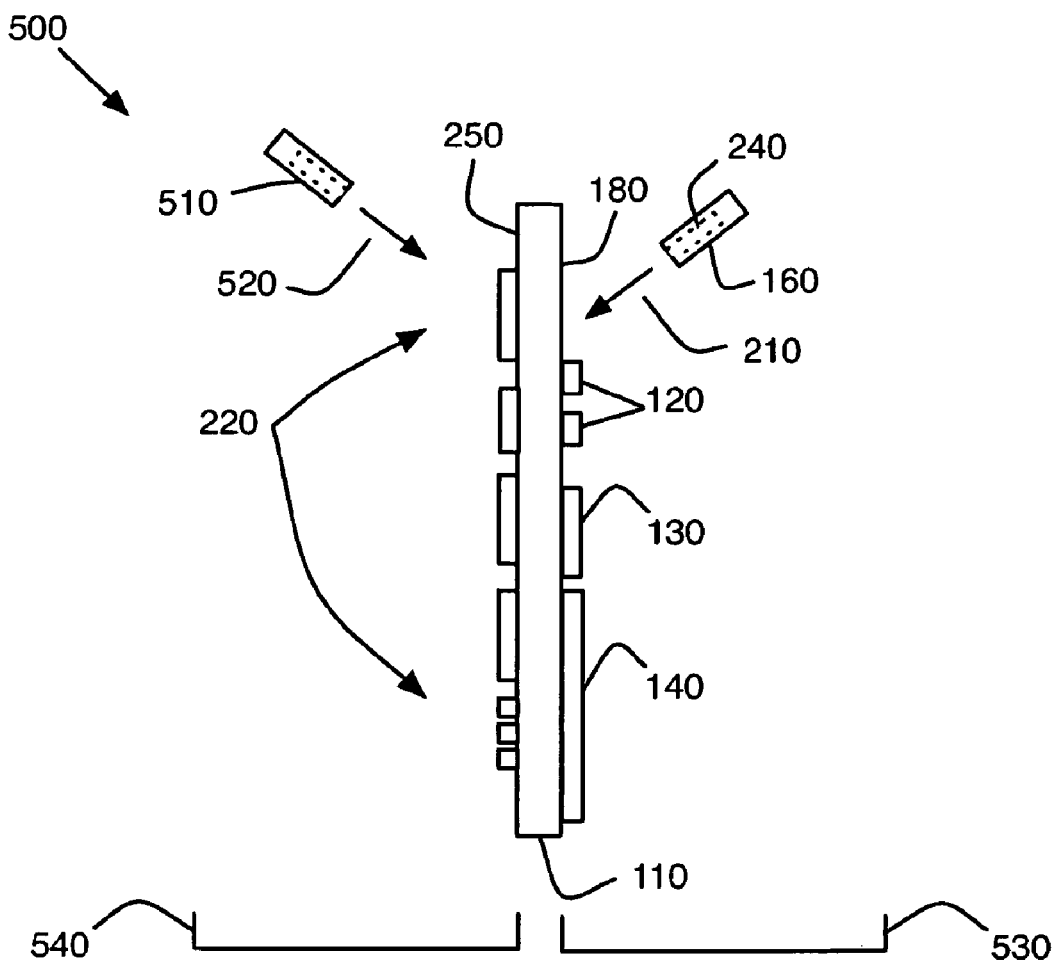
FIG. 5 is an illustration of an example apparatus for removing and segregating components from a printed circuit board.

FIG. 5 is an illustration of a side view of an example apparatus 500 for removing and segregating components and printed circuit board 110 in accordance with at least some embodiments described herein. Apparatus 500 may include directed air source 160, a directed air source 510, a collector 530 and a collector 540. Apparatus 500 may also include grippers for securing printed circuit board 100 as discussed herein, which are not shown for the sake of clarity of presentation. Any of the securing methods, techniques or devices discussed herein may be used.

As shown in FIG. 5, apparatus may include a directed air source 510 that may be configured to direct air 520 onto surface 250 of printed circuit board 110. Directed air source 510 may include any of the characteristics described herein with respect to directed air source 160. Directed air source 510 may be configured to direct air 520 onto surface 250 in any manner or using any parameters as discussed herein with respect to air 210 and directed air source 160. Components 220 may include any of the components discussed herein, and the components may be categorized for segregation by type using any of the methods or techniques discussed herein.

In an example, directed air source 160 may be configured to provide air for a front side of printed circuit board 110 and directed air source 510 may provide air for a back side of printed circuit board 110. In an example air 210 and air 520 may be provided simultaneously. In other examples, air 210 and air 520 may be provided separately. The air knives may be operated or controlled together or they may be operated or controlled separately.

Apparatus 500 may include collectors 530, 540. Collectors 530, 540 may include any of the devices described herein. In an example, collector 530 may be configured to collect components from the front side of printed circuit board 110 and collector 540 may be configured to collect components from the back side of printed circuit board 540.

As described herein with reference to FIGS. 1 to 4, components 120, 130, 140 may be collected together in collector 530 as they are removed or they may be segregated as they are removed from printed circuit board 110. Similarly, components 220 may be removed and collected together into collector 540 or they may be segregated into separate collectors as they are removed from printed circuit board 110. In some examples, components 120, 130, 140 may be segregated as they may be collected while components 220 may be collected without segregation. In other examples, components 220 may be segregated as they may be collected while components 120, 130, 140 may be collected without segregation. In other examples, components 120, 130, 140 may be segregated as they may be collected and components 220 may be segregated as they may be collected. In particular, the methods or techniques described herein with respect to FIG. 4 may be used for the removal of components 220, either simultaneously with or in series with the removal of components 120, 130, 140.

In some examples, printed circuit board 110 may be mounted as directed air sources 160, 510 may be moved. In other examples, directed air sources 160, 510 may be mounted as printed circuit board 110 may be moved. As discussed, directed air sources 160, 510 may use any of the parameters described herein in any combination. Directed air sources 160, 510 may use the same parameters during processing or they may use different parameters. As shown, in some examples, one directed air source may be used for each surface of printed circuit board 110. In other examples, any number of directed air sources may be used on the sides of printed circuit board 110. In some examples, two to six directed air sources may be used. In other examples, six to 20 directed air sources may be used. Each side of printed circuit board 110 may have the same number of directed air sources or they may have different number of directed air sources. As is discussed further herein with respect to FIG. 7, apparatus 500 may be coupled to a process control unit that may control the various components of the process unit or apparatus 500.

Figure 6:
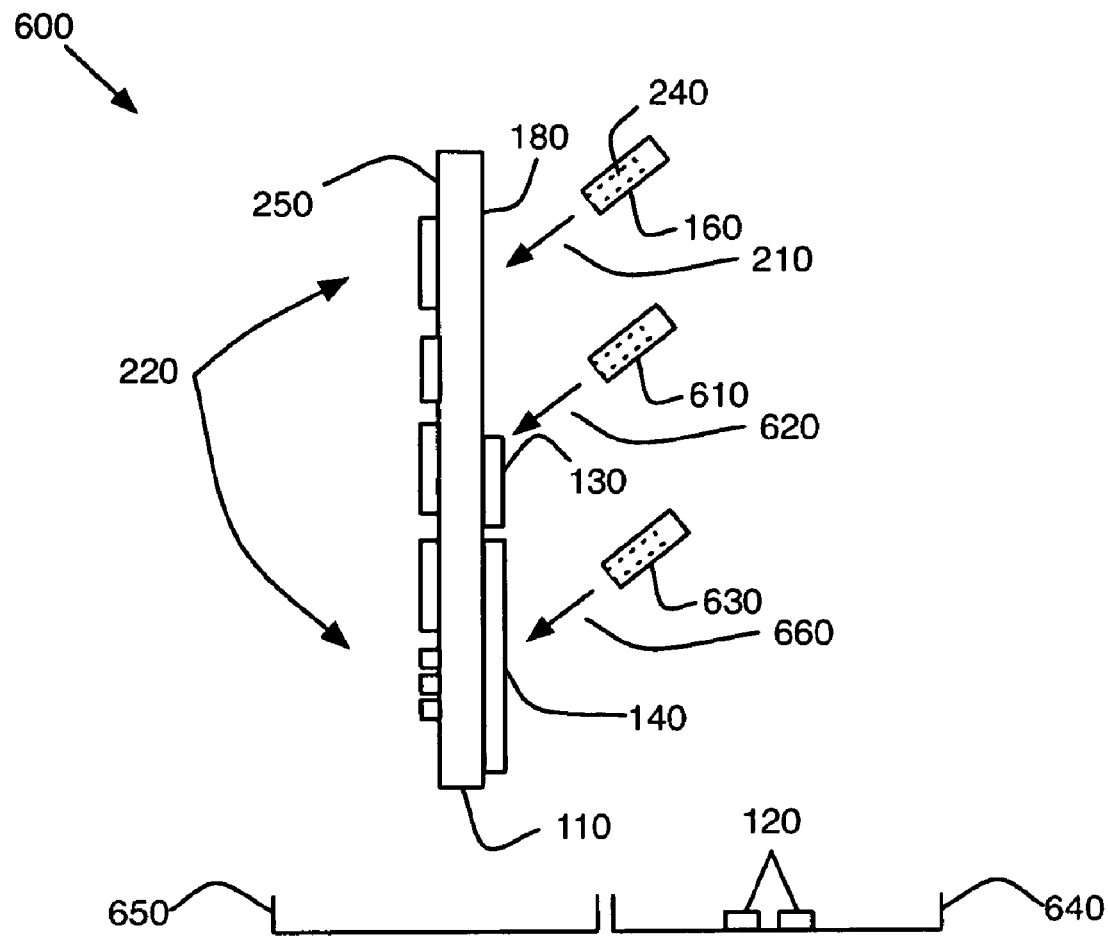
FIG. 6 is an illustration of an example apparatus for removing and segregating components from a printed circuit board.

FIG. 6 is an illustration of a side view of an example apparatus 600 for removing and segregating components and printed circuit board 110, arranged in accordance with at least some examples described herein. Apparatus 600 may include directed air source 160, a directed air source 610, a directed air source 630, a collector 640 and a collector 650. Apparatus 600 may also include grippers for securing printed circuit board 100 as described herein, which are not shown for the sake of clarity of presentation. Any of the securing methods, techniques or devices described herein may be used.

As shown in FIG. 6, apparatus 600 may include directed air source 610 that may be configured to direct air 620 onto surface 180 of printed circuit board 110. Apparatus may also include directed air source 630, which may be configured to direct air 660 onto surface 180 of printed circuit board 110. Directed air sources 610, 630 may include any of the characteristics described herein with respect to directed air source 160 and they may direct air onto surface 180 in any manner or using any parameters as described herein. Apparatus 600 may also include an directed air source or directed air sources for surface 250 as discussed herein with respect to FIG. 5.

In various examples, directed air sources 160, 610, 630 may be configured to direct air onto surface 180. They may be configured to direct air using the same parameters or they may use different parameters. In an example, the directed air sources may be configured to move in a downward direction and they energy imparted onto surface 180 may increase as the directed air sources scan across surface 180 in series. For example, directed air source 630 may use parameters that impart the relatively lowest amount of energy or force, directed air source 160 may impart the relatively highest amount of energy or force, and directed air source 610 may use parameters that impart more energy or force than directed air source 630 but less than directed air source 160. In such an example, as directed air source 630 completes scanning surface 180 a certain type of components may be removed while other components may remain. In the illustrated example, components 120 may have been removed into collector 640 as air 660 may have scanned across surface 180. As directed air source 610 may be scanned across surface 180, another type or category of components may be collected into collector 650, such as, for example, components 130. As directed air source 160 may be scanned across surface 180 a last type or category of components may be collected into a collector (not shown for the sake of clarity of presentation). As is discussed further herein with respect to FIG. 7, apparatus 100 may be coupled to a process control unit that may control the various components of the process unit or apparatus 100.

Any suitable number of directed air sources may be used. In the illustrated example, three directed air sources may be used. In an example, two directed air sources may be used. In other examples, four to 20, or more directed air sources may be used. Apparatus 600 may include collectors 640, 650. Collectors 640, 650 may include any of the collectors discussed herein.

As described herein with reference to FIGS. 1 to 5, components 120, 130, 140 may be collected together in a single collector as they are removed or they may be segregated as they may be removed from printed circuit board 110. Similarly, as discussed, apparatus 600 may be used to segregate components 120, 130, 140 as they may be removed from printed circuit board 110. In an example, the methods or techniques described herein with respect to FIG. 3 or 4 may be used for the removal of components 120, 130, 140 with apparatus 600.

In some examples, printed circuit board 110 may be mounted as directed air sources 160, 610, 630 may be moved. In other examples, directed air sources 160, 610, 630 may be mounted as printed circuit board 110 may be moved. As discussed, directed air sources 160, 610, 630 may be configured by any of the parameters described herein in any combination. In some examples, components 120, 130, 140 may be removed from surface 180 and the orientation of printed circuit board 110 and directed air source 160 may be modified such that directed air source 160 may be situated to remove components 220. Directed air sources 160, 610, 630 may use the same parameters during processing or they may use different parameters.

Figure 7:
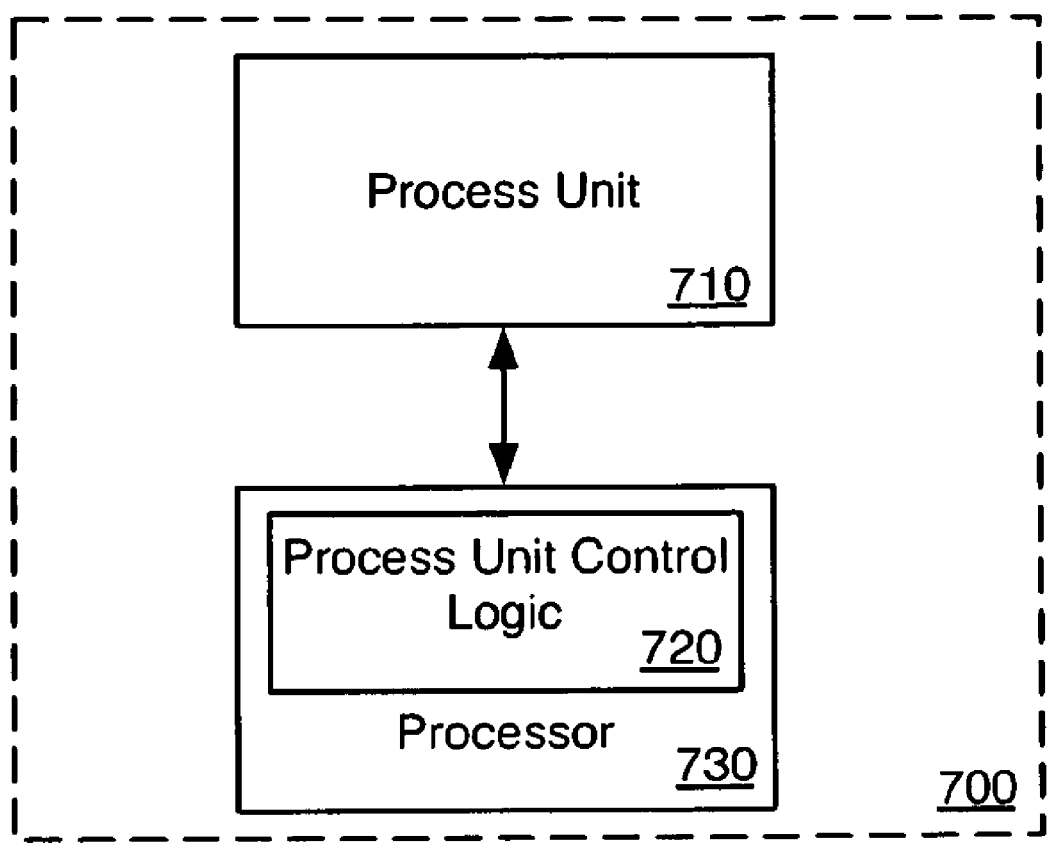
FIG. 7 is an illustration of an example system for removing and segregating components from a printed circuit board.

Turning now to other embodiments that may perform any of the methods as described herein, FIG. 7 illustrates an example system 700 for the removal and segregation of components from a printed circuit board in accordance with at least some embodiments of the present disclosure. System 700 may be used to perform some or all of the functions described herein in connection with FIGS. 1 to 6. System 700 may include a process unit 710 operably coupled to a processor 730 that may include process unit control logic 720. Process unit 710 may include any or all of the process unit characteristics as described herein. In some examples, process unit 710 may include grippers configured to secure a printed circuit board, a directed air source and a collector configured to collect removed components. In an example, the components of the process unit may be housed in a chamber. The process unit may also include electro-mechanical devices that may be configured to actuate the various components. In some examples, the grippers, the directed air source or directed air sources or the collector or collectors may be automatically or robotically actuated.

In some examples, system 700 may include a processor 730. In some examples, processor 730 may be implemented as part of a computer system. System 700 may include process unit control logic 720 that may be configured to undertake various methods, functional operations, actions, or blocks such as those described previously for FIGS. 1 to 6. Further, system 700 may include additional items such as memory, a router, network interface logic, etc. Process unit control logic 720 may be configured to provide any of the functionality described herein and claimed subject matter is not limited to specific types or manifestations of processing logic. For example, processor 730 may be a microprocessor or Central Processing Unit (CPU). In other implementations, processor 730 may be an Application Specific Integrated Circuit (ASIC), a Field Programmable Gate Array (FPGA), a digital signal processor (DSP), or other integrated formats. Processor 730 and process unit 710 may communicate by any suitable means, such as, for example, by wired connections or wireless connections.

FIG. 8 illustrates an example computer program product 800 that is arranged in accordance with at least some embodiments of the present disclosure. Computer program product 800 may include a signal bearing medium 802. Signal bearing medium 802 may include one or more machine-readable instructions 804, which, when executed by one or more processors, may operatively enable a computing device to provide the functionality described herein with respect to FIGS. 1 to 7. Thus, for example, referring to the system of FIG. 7, processor 730 may undertake one or more of the actions shown in FIGS. 1 to 6 in response to instructions 804 conveyed by medium 802.

In some implementations, signal bearing medium 802 may encompass a computer-readable medium 806, such as, but not limited to, a hard disk drive, a Compact Disc (CD), a Digital Video Disk (DVD), a digital tape, memory, etc. In some implementations, signal bearing medium 802 may encompass a recordable medium 808, such as, but not limited to, memory, read/write (R/W) CDs, R/W DVDs, etc. In some implementations, signal bearing medium 802 may encompass a communications medium 810, such as, but not limited to, a digital and/or an analog communication medium (e.g., a fiber optic cable, a waveguide, a wired communication link, a wireless communication link, etc.).

Figure 9:
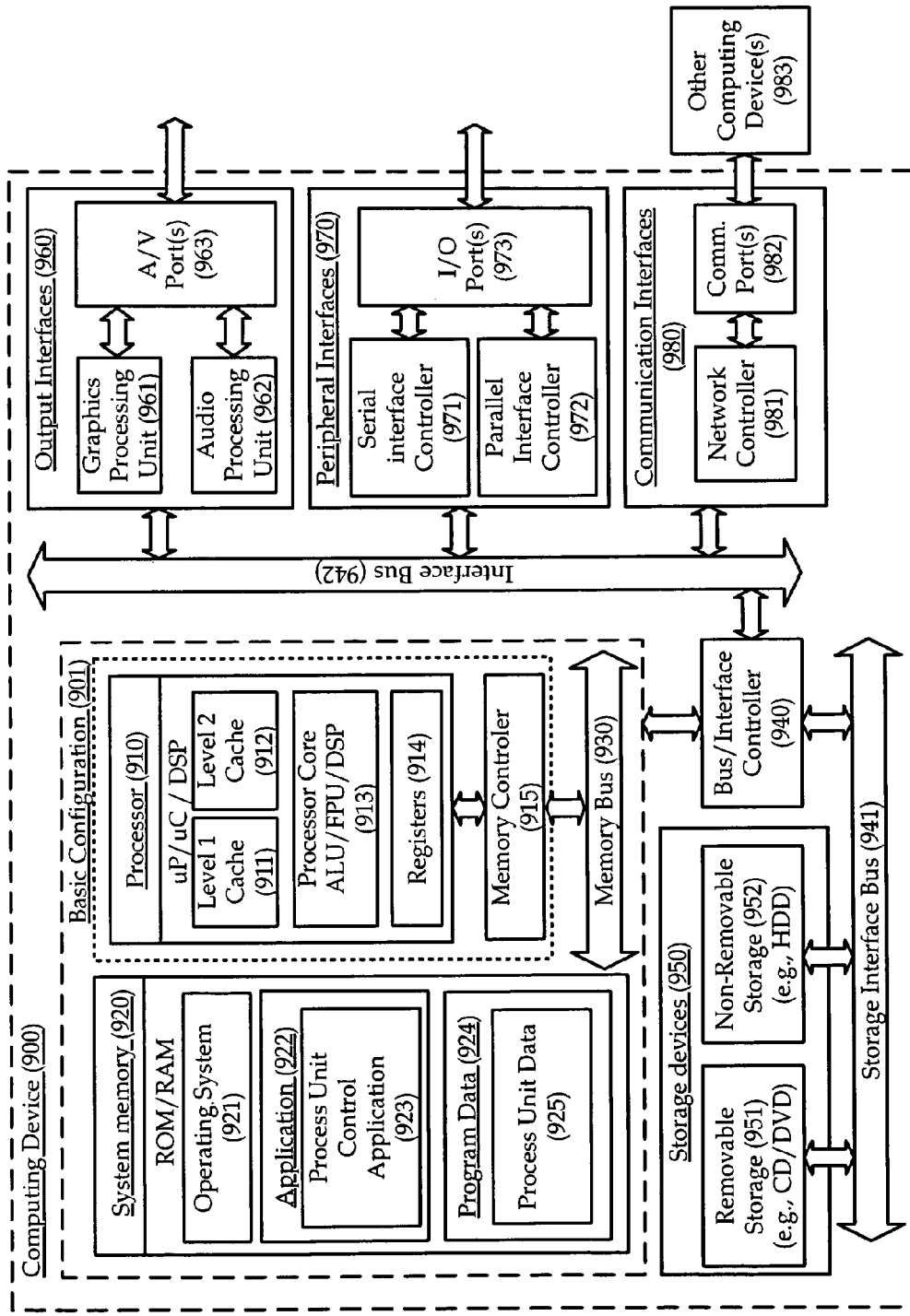
FIG. 9 is a block diagram illustrating an example computing device, all arranged in accordance with at least some embodiments of the present disclosure.

FIG. 9 is a block diagram illustrating an example computing device 900 that is arranged in accordance with at least some embodiments of the present disclosure. In one example basic configuration 901, computing device 900 may include one or more processors 910 and system memory 920. A memory bus 930 can be used for communicating between the processor 910 and the system memory 920.

Depending on the desired configuration, processor 910 may be of any type including but not limited to a microprocessor (µP), a microcontroller (µC), a digital signal processor (DSP), or any combination thereof. Processor 910 can include one or more levels of caching, such as a level one cache 911 and a level two cache 912, a processor core 913, and registers 914. The processor core 913 can include an arithmetic logic unit (ALU), a floating point unit (FPU), a digital signal processing core (DSP Core), or any combination thereof. A memory controller 915 can also be used with the processor 910, or in some implementations the memory controller 915 can be an internal part of the processor 910.

Depending on the desired configuration, the system memory 920 may be of any type including but not limited to volatile memory (such as RAM), non-volatile memory (such as ROM, flash memory, etc.) or any combination thereof. System memory 920 may include an operating system 921, one or more applications 922, and program data 924. Application 922 may include process unit control application 923 that can be arranged to perform the functions, actions, and/or operations as described herein including the functional blocks, actions, and/or operations described with respect to FIGS. 1 to 7. Program Data 924 may include process unit data 925 for use with the flash memory algorithm 923. In some example embodiments, application 922 may be arranged to operate with program data 924 on an operating system 921. This described basic configuration is illustrated in FIG. 9 by those components within dashed line 901.

Computing device 900 may have additional features or functionality, and additional interfaces to facilitate communications between the basic configuration 901 and any required devices and interfaces. For example, a bus/interface controller 940 may be used to facilitate communications between the basic configuration 901 and one or more data storage devices 950 via a storage interface bus 941. The data storage devices 950 may be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of device 900.

Computing device 900 may also include an interface bus 942 for facilitating communication from various interface devices (e.g., output interfaces, peripheral interfaces, and communication interfaces) to the basic configuration 901 via the bus/interface controller 940. Example output interfaces 960 may include a graphics processing unit 961 and an audio processing unit 962, which may be configured to communicate to various external devices such as a display or speakers via one or more NV ports 963. Example peripheral interfaces 970 may include a serial interface controller 971 or a parallel interface controller 972, which may be configured to communicate with external devices such as input devices (e.g., keyboard, mouse, pen, voice input device, touch input device, etc.) or other peripheral devices (e.g., printer, scanner, etc.) via one or more I/O ports 973. An example communication interface 980 includes a network controller 981, which may be arranged to facilitate communications with one or more other computing devices 983 over a network communication via one or more communication ports 982. A communication connection is one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 900 may also be implemented as a personal computer including both laptop computer and non-laptop computer configurations. In addition, computing device 900 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In some embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Video Disk (DVD), a digital tape, a computer memory, etc.; and a transmission type medium such as a digital and/or an analog communication medium (e.g., a fiber optic cable, a waveguide, a wired communication link, a wireless communication link, etc.).

The herein described subject matter sometimes illustrates different components contained within, or connected with, different other components. It is to be understood that such depicted architectures are merely examples and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While certain example techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A method for removing components from a printed circuit board comprising:
   securing the printed circuit board;
   directing a first air onto a first surface of the printed circuit board, the first surface being substantially a front side of the printed circuit board, with a first directed air source to remove a first component from the printed circuit board, wherein the first component is a wired component;
   collecting the first component; and
   directing a second air onto a second surface of the printed circuit board, the second surface being substantially a back side of the printed circuit board, with a second directed air source to remove a second component from the printed circuit board, wherein the second component is a surface mounted component, and directing the first air and directing the second air occur substantially simultaneously.

2. The method of claim 1, wherein the first air is either cooled air or heated air.

3. The method of claim 1, further comprising:
   selecting a parameter for directing the first air onto the first surface, wherein the parameter is selected such that the first air removes the first component but does not remove a third component.

4. The method of claim 3, wherein the parameter for directing the first air comprises at least one of an air velocity, an air temperature, a directed air source scan duration or a directed air source scan path.

5. The method of claim 3, wherein the first component is a surface mount device.

6. The method of claim 5, wherein the third component is a through hole device.

7. The method of claim 1, further comprising:
   collecting the second component, wherein the first component is collected in a first collector and the second component is collected in a second collector.

8. The method of claim 1, wherein directing the first air onto the first surface of the printed circuit board includes providing the first air at a first velocity over a first part of the first surface and providing the first air at a second velocity over a second part of the first surface.

9. The method of claim 1, wherein securing the printed circuit board includes clamping the printed circuit board with a robotic gripper assembly.

10. The method of claim 1, wherein the first directed air source comprises an air knife.

11. The method of claim 1, further comprising:
    determining an order of removal for the first component, the second component, a third component and a fourth component, wherein the determined order of removal is based at least in part on the energy required to remove the components.

12. The method of claim 11, wherein the determined order of removal includes removing components requiring less energy first.

* * * * *

UNITED STATES PATENT AND TRADEMARK OFFICE
CERTIFICATE OF CORRECTION

PATENT NO. : 8,366,874 B2
APPLICATION NO. : 13/131111
DATED : February 5, 2013
INVENTOR(S) : Meloni It is certified that error appears in the above-identified patent and that said Letters Patent is hereby corrected as shown below:

In the Drawings

In Fig. 9, Sheet 9 of 9, delete " 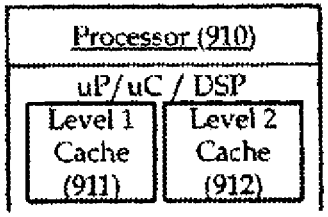 " and insert -- 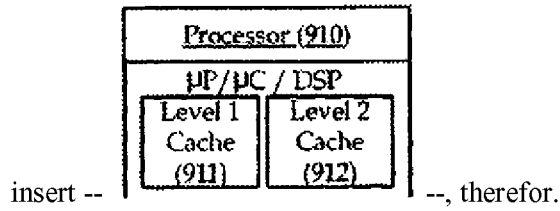 --, therefor.

In Fig. 9, Sheet 9 of 9, for Tag "915", in Line 1, delete "Controler" and insert -- Controller --, therefor.

In the Specifications

In Column 3, Line 39, delete "Apparatus 110" and insert -- Apparatus 100 --, therefor.

In Column 3, Line 51, delete "board 210" and insert -- board 110 --, therefor.

In Column 7, Line 21, delete "board 100" and insert -- board 110 --, therefor.

In Column 7, Line 22, delete "form" and insert -- from --, therefor.

In Column 9, Line 61, delete "board 100" and insert -- board 110 --, therefor.
In Column 10, Line 22, delete "board 540." and insert -- board 110. --, therefor.

Signed and Sealed this
Sixteenth Day of July, 2013

Teresa Stanek Rea
*Acting Director of the United States Patent and Trademark Office*

CERTIFICATE OF CORRECTION (continued)
U.S. Pat. No. 8,366,874 B2

In Column 11, Line 1, delete "board 100" and insert -- board 110 --, therefor.

In Column 11, Line 13, delete "an directed" and insert -- a directed --, therefor.

In Column 14, Line 6, delete "NV ports" and insert -- A/V ports --, therefor.